(12) United States Patent
Kobayashi et al.

(10) Patent No.: US 12,351,937 B2
(45) Date of Patent: Jul. 8, 2025

(54) PRODUCTION METHOD FOR SILICON MONOCRYSTAL

(71) Applicant: SUMCO Corporation, Tokyo (JP)

(72) Inventors: Shogo Kobayashi, Tokyo (JP); Norihito Fukatsu, Tokyo (JP); Takahiro Kanehara, Tokyo (JP); Hitomi Yamamoto, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 179 days.

(21) Appl. No.: 18/026,975

(22) PCT Filed: Sep. 21, 2021

(86) PCT No.: PCT/JP2021/034487
§ 371 (c)(1),
(2) Date: Mar. 17, 2023

(87) PCT Pub. No.: WO2022/071014
PCT Pub. Date: Apr. 7, 2022

(65) Prior Publication Data
US 2023/0340691 A1    Oct. 26, 2023

(30) Foreign Application Priority Data
Sep. 29, 2020 (JP) .................. 2020-163638

(51) Int. Cl.
*C30B 29/06* (2006.01)
*C30B 15/04* (2006.01)
*C30B 15/14* (2006.01)

(52) U.S. Cl.
CPC .............. *C30B 15/04* (2013.01); *C30B 15/14* (2013.01); *C30B 29/06* (2013.01)

(58) Field of Classification Search
CPC .......... C30B 15/04; C30B 15/14; C30B 29/06
See application file for complete search history.

(56) References Cited

U.S. PATENT DOCUMENTS

| | | | |
|---|---|---|---|
| 2009/0081856 A1* | 3/2009 | Umeno | ................. C30B 15/305 |
| | | | 257/E21.135 |
| 2012/0301386 A1 | 11/2012 | Johnson et al. | |

(Continued)

FOREIGN PATENT DOCUMENTS

| | | |
|---|---|---|
| JP | H03-247585 A | 11/1991 |
| JP | 2012-206874 A | 10/2012 |

(Continued)

OTHER PUBLICATIONS

ISR issued in International Patent Application No. PCT/JP2021/034487, Nov. 30, 2021, translation.

*Primary Examiner* — Hua Qi
(74) *Attorney, Agent, or Firm* — GREENBLUM & BERNSTEIN, P.L.C.

(57) ABSTRACT

Provided is a manufacturing method of a silicon single crystal according to the present invention includes a melting process for generating a silicon melt containing a primary dopant, and a crystal pulling-up process that pulls up a silicon single crystal from the silicon melt. The crystal pulling-up process includes at least one additional doping process for adding a dopant raw material containing a secondary dopant into the silicon melt. A flow rate of Ar gas during a first period in which the secondary dopant is not added is set as a first flow rate, and the flow rate of Ar gas during a second period that includes a period in which the secondary dopant is added is set as a second flow rate that is greater than the first flow rate.

9 Claims, 6 Drawing Sheets

(56) References Cited

U.S. PATENT DOCUMENTS

| | | |
|---|---|---|
| 2016/0237589 A1 | 8/2016 | Soeta et al. |
| 2017/0260645 A1* | 9/2017 | Hoshi .................... C30B 15/20 |
| 2018/0087179 A1* | 3/2018 | Zepeda .................. C30B 15/04 |
| 2018/0237937 A1 | 8/2018 | Kang et al. |
| 2020/0040480 A1 | 2/2020 | Sugimura et al. |
| 2020/0141024 A1* | 5/2020 | Maegawa ............... C30B 29/06 |

FOREIGN PATENT DOCUMENTS

| | | |
|---|---|---|
| JP | 2014-511146 A | 5/2014 |
| JP | 2014-125402 A | 7/2014 |
| JP | 2015-101498 A | 6/2015 |
| JP | 2016-060667 A | 4/2016 |
| JP | 2016-216306 A | 12/2016 |
| JP | 2018-140915 A | 9/2018 |
| JP | 2018-525308 A | 9/2018 |
| WO | 2009/025336 A1 | 2/2009 |
| WO | WO-2018198606 A1 * 11/2018 | ............. C30B 15/04 |

* cited by examiner

PRODUCTION METHOD FOR SILICON MONOCRYSTAL

FIELD OF THE INVENTION

The present invention relates to a manufacturing method of a silicon single crystal by the Czochralski (CZ) method, and particularly relates to a method of supplying an additional dopant during a crystal pulling-up step.

BACKGROUND OF THE INVENTION

A large number of silicon single crystals that become substrate materials for semiconductor devices are manufactured by the CZ method. The CZ method grows a large-diameter single crystal below a seed crystal by immersing the seed crystal in a silicon melt stored in a quartz crucible and gradually pulling up the seed crystal while rotating the seed crystal and the quartz crucible. According to the CZ method, a high-quality silicon single crystal can be manufactured with a high yield.

Various doping agents (dopants) are used in growing the silicon single crystal to adjust electrical resistivity (hereafter, simply referred to as resistivity) of the single crystal. Typical dopants include boron (B), phosphorus (P), arsenic (As), and antimony (Sb). Usually, these dopants are introduced with a polycrystalline silicon raw material into a quartz crucible and are melted together with the polycrystalline silicon by adding heat with a heater. Accordingly, a silicon melt including a predetermined amount of dopant is generated.

However, it is difficult to obtain a uniform resistivity in a pulling-up axis direction because a dopant concentration in the silicon single crystal changes in the pulling-up axis direction due to segregation. In order to resolve this issue, a method of supplying a dopant in the midst of pulling up a silicon single crystal is effective. For example, by adding a p-type dopant to the silicon melt in the midst of pulling up an n-type silicon single crystal, a decrease in the resistivity of the silicon single crystal from the impact of the segregation of an n-type dopant can be inhibited. Such a method of supplying an additional secondary dopant of the opposite conductivity type from a primary dopant is called counter doping.

With regard to a technology of counter doping, Patent Literature 1 describes, for example, adding a dopant such that an input speed of the dopant (e.g., p-type) which is an opposite type from the type initially added (e.g., n-type) satisfies a predetermined relational expression. Also, Patent Literature 2 describes a method of controlling the resistivity in an axis direction of the grown silicon single crystal by inserting a rod-shaped silicon crystal containing the secondary dopant into a raw material melt.

RELATED ART

Patent Literature

Patent Literature 1: Japanese Patent Laid-open Publication No. H03-247585
Patent Literature 2: Japanese Patent Laid-open Publication No. 2016-216306

SUMMARY OF THE INVENTION

Problems to be Solved by the Invention

However, in counter doping where a granular dopant is added to a silicon melt in a quartz crucible, a solid dopant is incorporated into a solid-liquid interface before the solid dopant is dissolved in the melt, causing dislocation in a silicon single crystal. This type of dislocation issue is particularly noticeable in pulling up a silicon single crystal for IGBT, in which a flow rate of Ar gas introduced into a pulling-up furnace is reduced to lower oxygen in the single crystal, and there is a need for an improvement.

Therefore, the present invention provides a manufacturing method of a silicon single crystal that can prevent dislocation of the single crystal in a counter doping method that adds a secondary dopant in the midst of pulling up the crystal.

Means for Solving the Problems

In order to resolve the above concerns, the manufacturing method of the silicon single crystal according to the present invention includes a melting step for generating a silicon melt containing a primary dopant, and a crystal pulling-up step that pulls up the silicon single crystal from the silicon melt. The crystal pulling-up step includes at least one additional doping step for adding a secondary dopant into the silicon melt, and the flow rate of Ar gas supplied to a pulling-up furnace during a first period in which the secondary dopant is not added is set as a first flow rate, and the flow rate of Ar gas supplied to the pulling-up furnace during a second period that includes a period in which the secondary dopant is added is set as a second flow rate that is greater than the first flow rate.

According to the present invention, it is possible to prevent dislocation of the silicon single crystal which is caused by the secondary dopant added into the silicon melt reaching the solid-liquid interface and being incorporated into the silicon single crystal in a non-melted state.

In the present invention, an amount of increase in the second flow rate with respect to the first flow rate is preferably 40 L/min or more and 300 L/min or less in a flow rate conversion at room temperature and atmospheric pressure. When less than 40 L/min, the effect is small, and when more than 300 L/min, the melt surface temperature may decrease and there is a risk of dislocation of the single crystal. In particular, the amount of increase in the second flow rate with respect to the first flow rate is preferably 80 L/min or more and 160 L/min or less. In addition, the second flow rate is preferably 120 L/min or more in the flow rate conversion at room temperature and atmospheric pressure, preferably 1.5 times or more and 5 times or less of the first flow rate, and preferably 2 times or more and 3 times or less in particular. Accordingly, it is possible to prevent dislocation of the silicon single crystal caused by the non-melted secondary dopant being incorporated into the solid-liquid interface.

In the present invention, the additional doping step preferably increases the Ar gas flow rate to the second flow rate before beginning to add the secondary dopant, and restores the Ar gas flow rate to the first flow rate after addition of the secondary dopant ends. By doing so, it is possible to further reduce a probability of the dopant added into the silicon melt being incorporated into the solid-liquid interface in the non-melted state.

In the present invention, it is preferable to set a pressure in the pulling-up furnace during the first period as a first pressure in a furnace, and set the pressure in the pulling-up furnace during the second period as a second pressure in a furnace that is lower than the first pressure in the furnace.

The probability of dislocation can be further reduced by changing the pressure in the furnace at the same time as an Ar gas flow rate.

In the present invention, an amount of decrease of the second pressure in the furnace with respect to the first pressure in the furnace is preferably 1 Torr or more and 10 Torr or less. Generally, the first pressure in the furnace is often several tens of Torr, and when the amount of decrease in the second pressure in the furnace exceeds 10 Torr, the second pressure in the furnace becomes too low and there is a risk for causing dislocation of the single crystal that is pulled up. In addition, when the amount of decrease in the second pressure in the furnace is less than 1 Torr, the second pressure in the furnace is not much different from the first pressure in the furnace, and therefore it is difficult to obtain the effect of reducing the probability of dislocation. In contrast, when the amount of decrease in the second pressure in the furnace with respect to the first pressure in the furnace is 1 Torr or more and 10 Torr or less, the probability of dislocation of the single crystal can be further reduced.

The manufacturing method of the silicon single crystal according to the present invention preferably arranges a substantially cylindrical heat shielding member above the silicon melt to surround the silicon single crystal being pulled up from the silicon melt, and pulls up the silicon single crystal while controlling a flow speed of the Ar gas that is passing through a gap between the lower end of the heat shielding member and the melt surface. When pulling up a silicon single crystal with low oxygen concentration in the furnace where the heat shielding member is installed, the flow speed of the Ar gas flowing through the gap between the lower end of the heat shielding member and the melt surface needs to be precisely controlled. According to the present invention, by increasing the Ar gas flow rate during the counter doping, the flow speed of the Ar gas flowing from the center of the silicon single crystal toward an outer side near the melt surface of the silicon melt can be increased, preventing the non-melted dopant from approaching the solid-liquid interface. Particularly, when the secondary dopant is added closer to the quartz crucible than to the lower end of the heat shielding member, the flow speed of the Ar gas that passes through the gap between the lower end of the heat shielding member and the melt surface and flows from a center axis side of the silicon single crystal toward the outer side can be increased, which is effective in preventing the non-melted dopant from approaching the solid-liquid interface.

In the present invention, the oxygen concentration in the silicon single crystal is preferably $6\times10^{17}$ atoms/cm$^3$ (ASTM F-121, 1979) or less, and more preferably $4\times10^{17}$ atoms/cm$^3$ (ASTM F-121, 1979) or less. In addition, the electrical resistivity of the silicon single crystal is preferably 10 Ωcm or more and 1000 Ωcm or less, and more preferably 20 Ωcm or more and 100 Ωcm or less. In this way, when pulling up a silicon single crystal with a low oxygen concentration and narrow resistivity range, it is necessary to reduce the Ar gas flow rate in the furnace during the crystal pulling-up step. When the counter doping is performed under a condition where the Ar gas flow rate is low, the probability of dislocation of the silicon single crystal increases. However, when the Ar gas flow rate is increased only during a counter doping step as in the present invention, the probability of dislocation of the silicon single crystal can be reduced.

In addition, the manufacturing method of the silicon single crystal according to the present invention includes the melting step for generating the silicon melt containing the primary dopant, and the crystal pulling-up step that pulls up the silicon single crystal from the silicon melt. The crystal pulling up step includes at least one additional doping step for adding the secondary dopant into the silicon melt, and the pressure in the pulling-up furnace during the first period in which the secondary dopant is not added is set as the first pressure in the furnace, and the pressure in the pulling-up furnace during the second period that includes the period in which the secondary dopant is added is set as the second pressure in the furnace that is lower than the first pressure in the furnace.

According to the present invention, it is possible to prevent dislocation of the silicon single crystal which is caused by the secondary dopant added into the silicon melt reaching the solid-liquid interface and being incorporated into the silicon single crystal in the non-melted state.

In the present invention, an amount of decrease of the second pressure in the furnace with respect to the first pressure in the furnace is preferably 1 Torr or more and 10 Torr or less. Generally, the first pressure in the furnace is often several tens of Torr, and when the amount of decrease in the second pressure in the furnace exceeds 10 Torr, the second pressure in the furnace becomes too low and there is a risk for causing dislocation of the single crystal that is pulled up. In addition, when the amount of decrease in the second pressure in the furnace is less than 1 Torr, the second pressure in the furnace is not much different from the first pressure in the furnace, and therefore it is difficult to obtain the effect of reducing the probability of dislocation. In contrast, when the amount of decrease in the second pressure in the furnace with respect to the first pressure in the furnace is 1 Torr or more and 10 Torr or less, the probability of dislocation of the single crystal can be further reduced.

Effect of the Invention

The present invention provides a manufacturing method of the silicon single crystal that can prevent dislocation of the single crystal in the counter doping method that adds the secondary dopant in the midst of pulling up the crystal.

MODE FOR CARRYING OUT THE INVENTION

Hereafter, a preferred embodiment of the present invention is described in detail with reference to the attached drawings.

Figure 1:
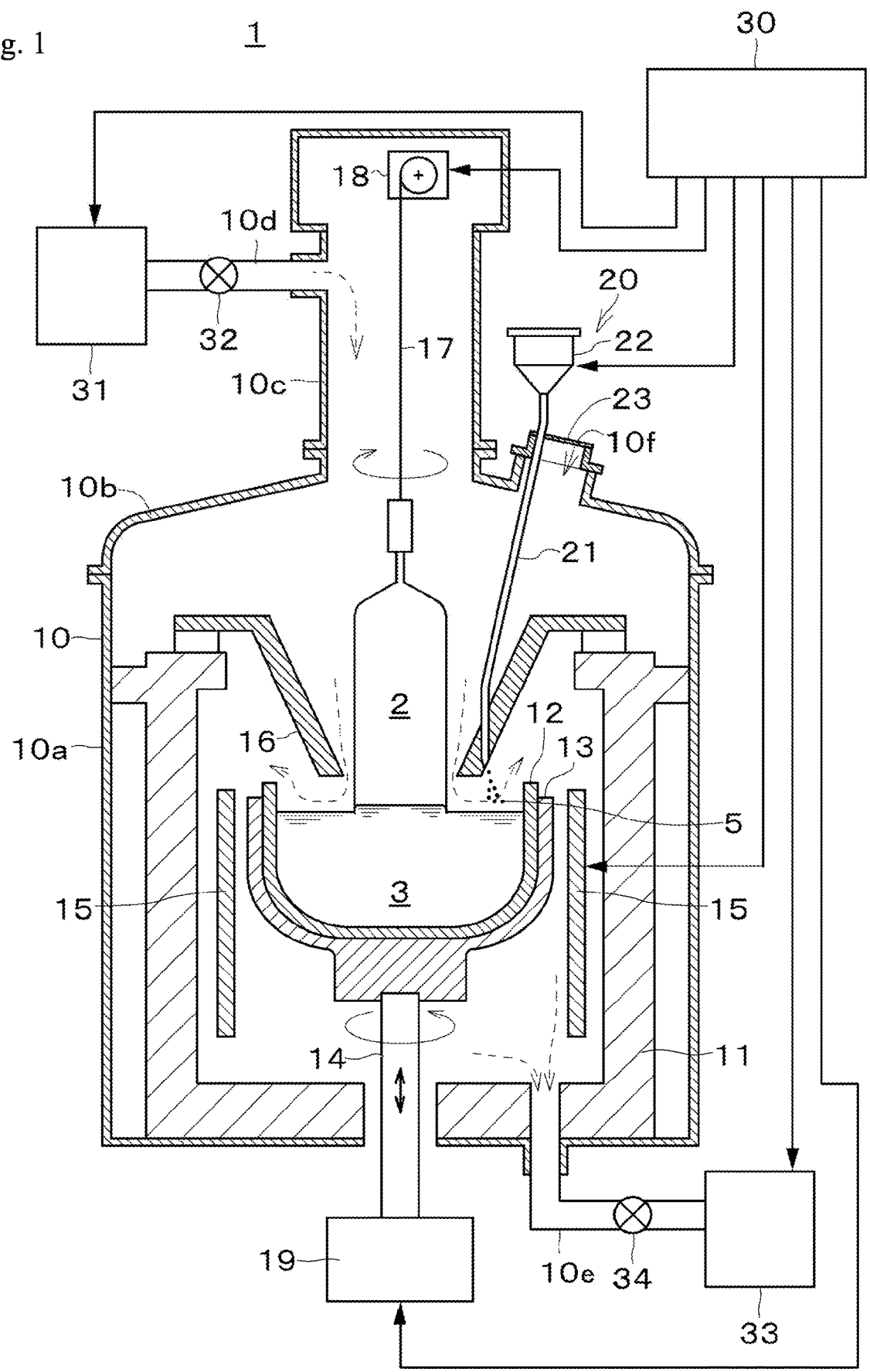
FIG. 1 is a cross-sectional view substantially illustrating a configuration of a single crystal manufacturing device according to an embodiment of the present invention.

FIG. 1 is a cross-sectional view substantially illustrating a configuration of a single crystal manufacturing device according to an embodiment of the present invention.

As shown in FIG. 1, a single crystal manufacturing device 1 includes a chamber 10 configuring a pulling-up furnace for a silicon single crystal 2, a quartz crucible 12 that is installed inside the chamber 10, a graphite susceptor 13 supporting the quartz crucible 12, a shaft 14 supporting the susceptor 13 so as to be capable of elevation and rotation, a heater 15 that is positioned surrounding the susceptor 13, a heat shielding member 16 that is positioned above the quartz crucible 12, a single crystal pulling-up wire 17 that is positioned above the quartz crucible 12 and on the same axis with the shaft 14, a wire winding mechanism 18 that is positioned on the upper side of the chamber 10, a dopant supply device 20 supplying a dopant raw material 5 into the quartz crucible 12, and a controller 30 controlling various components.

The chamber 10 is configured with a main chamber 10a, a top chamber 10b covering an upper opening of the main chamber 10a, and a slender cylindrical pull chamber 10c which is connected to an upper opening of the top chamber 10b; and the quartz crucible 12, susceptor 13, heater 15, and the heat shielding member 16 are provided in the main chamber 10a. The susceptor 13 is fixed to an upper end of the shaft 14 which is provided passing through a bottom center of the chamber 10 in a vertical direction, and the shaft 14 is driven to rotate and elevate by a shaft driving mechanism 19.

The heater 15 is used to melt a polycrystalline silicon raw material filled in the quartz crucible 12 to generate a silicon melt 3. The heater 15 is a resistance heater made of carbon and is provided surrounding the quartz crucible 12 inside the susceptor 13. A thermal insulation material 11 is provided outside of the heater 15. The thermal insulation material 11 is arranged along an interior wall of the main chamber 10a, thereby enhancing heat retention inside the main chamber 10a.

The heat shielding member 16 is provided to prevent heating of the silicon single crystal 2 by radiation heat from the heater 15 and the quartz crucible 12, and also suppress temperature fluctuation in the silicon melt 3. The heat shielding member 16 is a substantially cylindrical member with a diameter that decreases from an upper side toward a lower side, and is provided to cover the upper side of the silicon melt 3, and to surround the silicon single crystal 2 during growing. Using graphite as a material for the heat shielding member 16 is preferred. An opening larger than the diameter of the silicon single crystal 2 is provided in the center of the heat shielding member 16, thereby ensuring a pulling-up path of the silicon single crystal 2. As shown in the drawing, the silicon single crystal 2 is pulled upward through the opening. The diameter of the opening of the heat shielding member 16 is smaller than an aperture of the quartz crucible 12, and the lower end portion of the heat shielding member 16 is located toward an inner side of the quartz crucible 12, and therefore, the heat shielding member 16 does not interfere with the quartz crucible 12 even when an upper end of a rim of the quartz crucible 12 is raised above the lower end of the heat shielding member 16.

Although an amount of melt in the quartz crucible 12 decreases as the silicon single crystal 2 grows, by controlling the elevation of the quartz crucible 12 such that a space (gap) between a melt surface and the heat shielding member 16 is kept constant, temperature fluctuation of the silicon melt 3 is inhibited, and in addition an amount of evaporation of dopant from the silicon melt 3 can be controlled by keeping constant a flow speed of Ar gas flowing near the melt surface (purge gas guide path). Accordingly, the stability of crystal defect distribution, oxygen concentration distribution, resistivity distribution, and the like in the pulling-up axis direction of the single crystal can be improved.

The wire 17 which is the pulling-up axis of the silicon single crystal 2 and the wire winding mechanism 18 rolling up the wire 17 are provided above the quartz crucible 12. The wire winding mechanism 18 has a function to rotate the silicon single crystal 2 in addition to the wire 17. The wire winding mechanism 18 is arranged above the pull chamber 10c, and the wire 17 is extended downward from the wire winding mechanism 18 passing through the pull chamber 10c, and a distal end of the wire 17 reaches the inner space of the main chamber 10a. FIG. 1 shows a state where the silicon single crystal 2 in the middle of growth is suspended on the wire 17. When pulling up the single crystal, the single crystal is grown by immersing a seed crystal in the silicon melt 3 and pulling up the wire 17 gradually while rotating the quartz crucible 12 and the seed crystal respectively.

The top of the pull chamber 10c is provided with a gas inlet 10d for introducing Ar gas (purge gas) into the chamber 10, and the bottom of the main chamber 10a is provided with a gas exhaust port 10e for discharging Ar gas in the chamber 10.

In this example, Ar gas means that the primary component of the gas (over 50 vol. %) is argon and may include gas such as hydrogen and nitrogen.

An Ar gas supply source 31 is connected to the gas inlet 10d via a mass flow controller 32, and Ar gas from the Ar gas supply source 31 is introduced into the chamber 10 from the gas inlet 10d and the Ar gas amount to be introduced is controlled by the mass flow controller 32. In addition, Ar gas that is sealed in the chamber 10 is exhausted to outside of the chamber 10 from the gas exhaust port 10e, and therefore, it is possible to keep the inside of the chamber 10 clean by collecting SiO gas and CO gas that is in the chamber 10. The Ar gas flowing from the gas inlet 10d toward the gas exhaust port 10e passes through the opening of the heat shielding member 16, travels along the melt surface from the center of the pulling-up furnace to the outer side, and further descends to reach the gas exhaust port 10e.

A vacuum pump 33 is connected to the gas exhaust port 10e via a pipe, and the chamber 10 is kept at a steady reduced pressure state by controlling with a valve 34 the flow rate of Ar gas while suctioning the Ar gas in the chamber 10 with the vacuum pump 33. The pressure in the chamber 10 is measured by a pressure gauge, and an amount of Ar gas exhausted from the gas exhaust port 10e is controlled such that the pressure in the chamber 10 remains steady.

The dopant supply device 20 includes a dopant supply tube 21 that is pulled into the inside of the chamber 10 from the outside of chamber 10, a dopant hopper 22 that is arranged outside of the chamber 10 and is connected to an upper end of the dopant supply tube 21, and a seal cap 23 that seals off an opening 10f of the top chamber 10b through which the dopant supply tube 21 passes.

The dopant supply tube 21 is a pipe that reaches from a position where the dopant hopper 22 is arranged to immediately above the silicon melt 3 in the quartz crucible 12 by passing through the opening 10f of the top chamber 10b. While pulling up the silicon single crystal 2, the dopant supply device 20 supplies additional dopant raw material 5 into the silicon melt 3 in the quartz crucible 12. The dopant raw material 5 discharged from the dopant hopper 22 is supplied to the silicon melt 3 by passing through the dopant supply tube 21.

The dopant raw material 5 supplied from the dopant supply device 20 is granular silicon containing a secondary dopant. Such a dopant raw material 5 is prepared by growing a silicon crystal containing a high concentration of secondary dopant by the CZ method, for example, and then crushing the silicon crystal into small pieces. But, the dopant raw material 5 used for counter doping is not limited to a silicon containing the secondary dopant, and can be a dopant alone or a compound containing a dopant atom. Further, the shape of the dopant raw material 5 is not limited to granular, and may also be a plate or rod shape.

Figure 2:
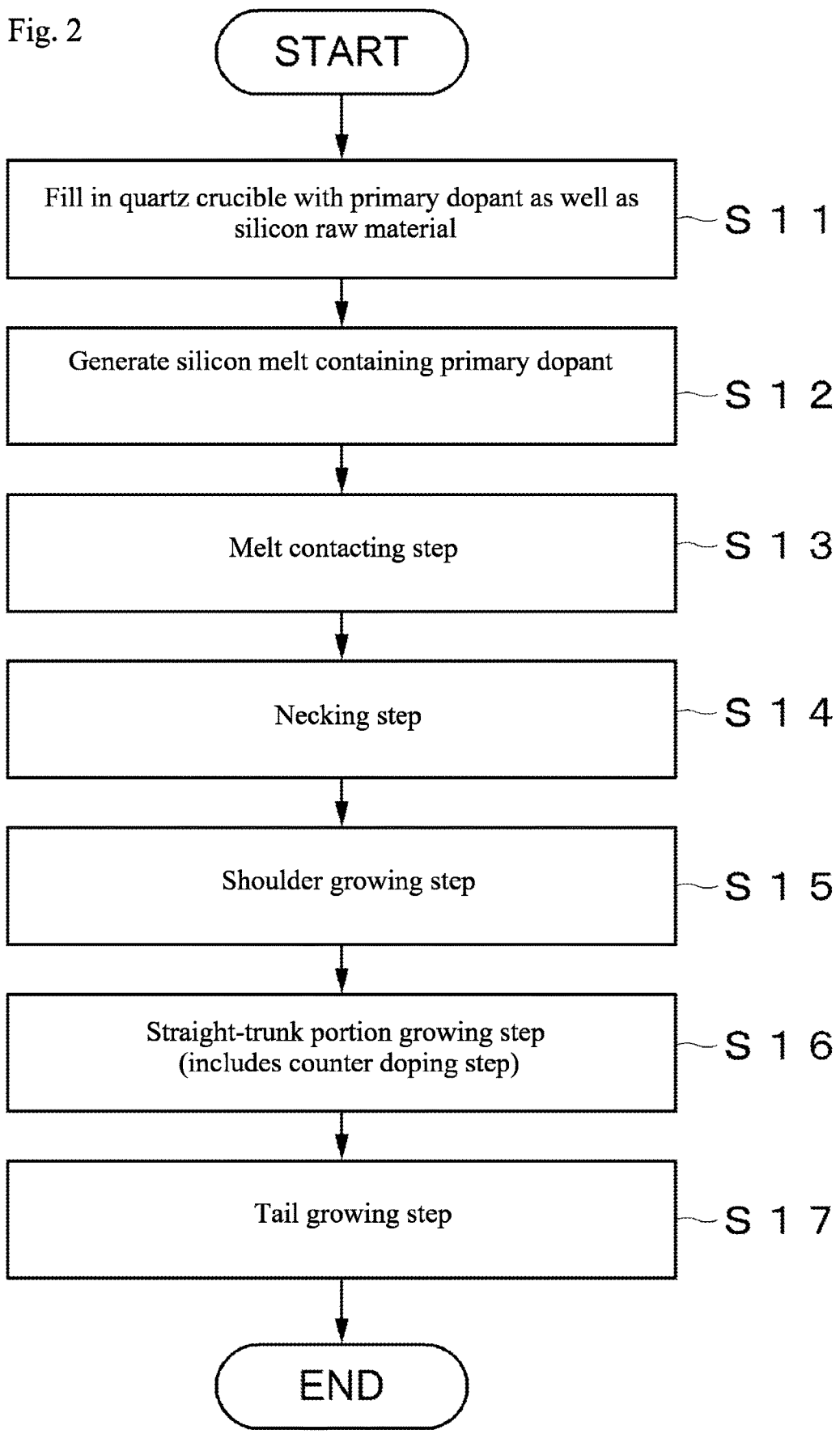
FIG. 2 is a flow chart describing a manufacturing method of a silicon single crystal according to the embodiment of the present invention.

FIG. 2 is a flow chart describing the manufacturing method of the silicon single crystal according to the embodiment of the present invention.

As shown in FIG. 2, in manufacturing of the silicon single crystal 2, the quartz crucible 12 is first filled with a primary dopant as well as the polycrystalline silicon raw material (raw material filling step S11). The primary dopant when pulling up an n-type silicon single crystal is phosphorus (P), arsenic (As), or antimony (Sb), for example, and the primary dopant when pulling up a p-type silicon single crystal is boron (B), aluminum (Al), gallium (Ga), or indium (In), for example. Next, the polycrystalline silicon in the quartz crucible 12 is melted by heating with the heater 15 and generates the silicon melt 3 containing the primary dopant (melting step S12).

Next, the seed crystal that is attached to the distal end of the wire 17 is lowered to be brought into contact with the silicon melt 3 (step S13). Then, crystal pulling-up steps (S14 to S17) that grow the single crystal by gradually pulling up the seed crystal while maintaining the state of contact with the silicon melt 3 are performed.

In the crystal pulling-up steps, a necking step S14 that forms a neck where the crystal diameter is narrowed thin to achieve non-dislocation; a shoulder growing step S15 that forms a shoulder where the crystal diameter gradually increases; a straight-trunk portion growing step S16 that forms a straight-trunk portion maintained at a specified crystal diameter (approximately 300 mm for example); and a tail growing step S17 that forms a tail where the crystal diameter gradually decreases are performed in order, and finally the single crystal is cut off from the melt surface. The above completes a silicon single crystal ingot.

The straight-trunk portion growing step S16 preferably includes at least one counter doping step (additional doping step) where a secondary dopant having the opposite conductivity type from the primary dopant included in the silicon single crystal 2 is added. Accordingly, a change of resistivity of the straight-trunk portion of the silicon single crystal 2 in a crystal length direction can be inhibited.

The oxygen concentration in a silicon single crystal for IGBT is preferably $6 \times 10^{17}$ atoms/cm$^3$ (ASTM F-121, 1979) or less, and more preferably $4 \times 10^{17}$ atoms/cm$^3$ (ASTM F-121, 1979) or less. In addition, the resistivity of the silicon single crystal for IGBT is preferably 10 Ωcm or more and 1000 Ωcm or less, and more preferably 20 Ωcm or more and 100 Ωcm or less.

In this way, in pulling up the silicon single crystal for IGBT with low oxygen concentration and a narrow resistivity range, slowing the flow speed of the Ar gas traveling along the melt surface from a center axis side of the pulling-up furnace toward the outer side is preferred, and when additional doping is performed under such a furnace condition, the probability of dislocation of the silicon single crystal increases. However, when the furnace condition during the counter doping step is changed according to the present embodiment, the probability of dislocation of the silicon single crystal can be reduced.

Figure 3:
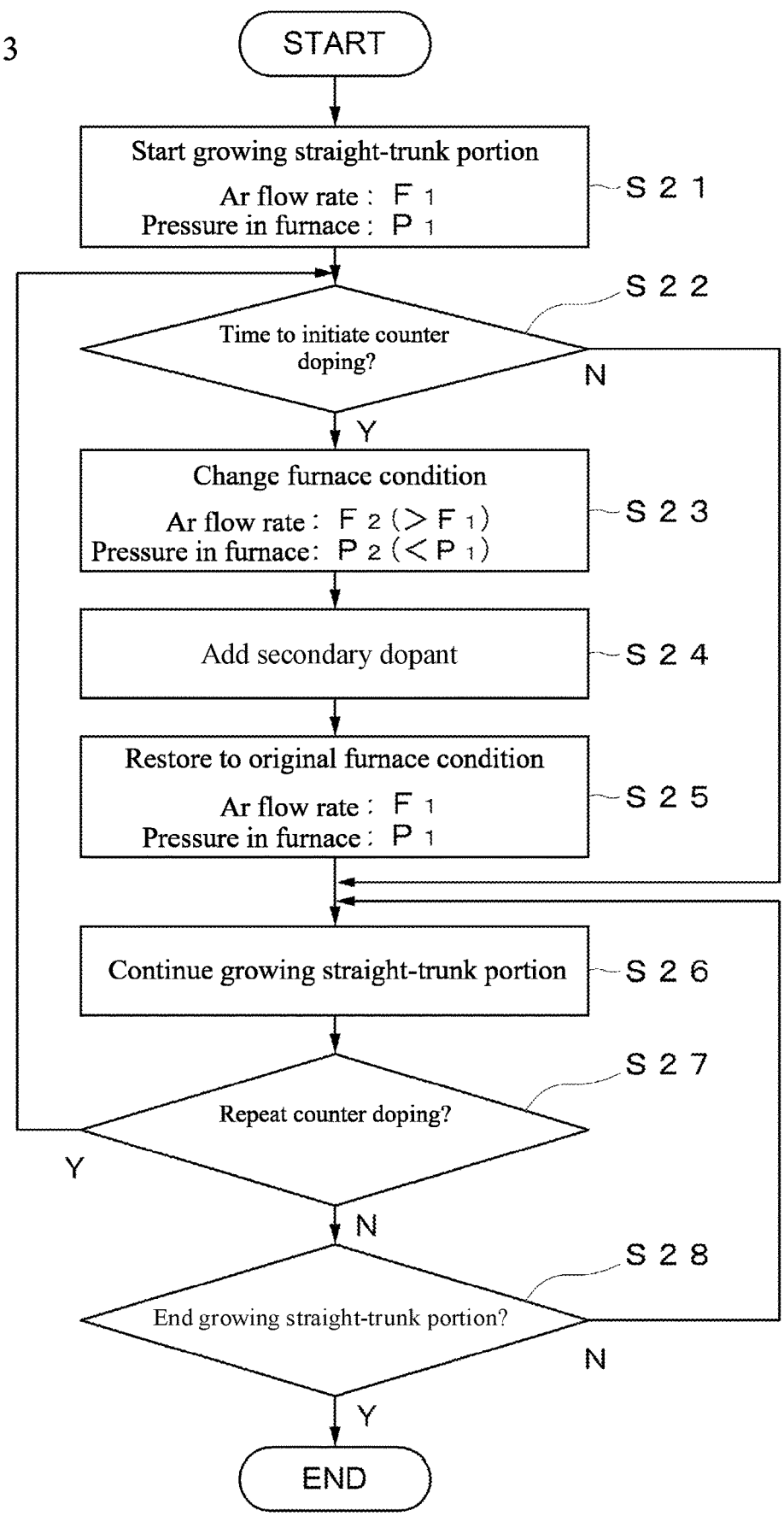
FIG. 3 is a flow chart describing a straight-trunk portion growing step S16 including a counter doping step.

FIG. 3 is a flow chart describing the straight-trunk portion growing step S16 including the counter doping step.

As shown in FIG. 3, when beginning the straight-trunk portion growing step S16, the Ar gas flow rate and the pressure in the furnace are set to values suitable for growing the silicon single crystal respectively (step S21). For example, in a case of the silicon single crystal for IGBT, low resistivity as well as a low interstitial oxygen concentration are sought. In order to grow such a silicon single crystal, the Ar gas flow rate must be smaller than that of a silicon single crystal for a general semiconductor device. The Ar gas flow rate required for the normal straight-trunk portion growing step S16 is defined as a first flow rate F1, and the pressure in the furnace is defined as a first pressure in the furnace P1.

The dopant concentration in the silicon single crystal increases as the crystal pulling-up advances, which may cause to deviate a desired resistivity range. Therefore, in the midst of the step, when a timing for the counter doping is required, the counter doping is initiated (steps S22Y, S23 to S25).

In the counter doping, the dopant raw material 5 containing the secondary dopant is added into the silicon melt 3 (step S24). The secondary dopant when pulling up the n-type silicon single crystal is boron (B), aluminum (Al), gallium (Ga), or indium (In), for example, and the secondary dopant when pulling up the p-type silicon single crystal is phosphorus (P), arsenic (As), or antimony (Sb), for example.

During the dopant adding period, the Ar gas flow rate and the pressure in the furnace are changed to values suitable for the counter doping respectively. The Ar gas flow rate $F_2$ (second flow rate) during the dopant adding period (second period) is set to a value greater than the Ar gas flow rate $F_1$ (first flow rate) during the normal crystal pulling-up period (first period) ($F_2 > F_1$). Further, a pressure in the furnace $P_2$ (second pressure in furnace) during the counter doping period is set to a value lower than the pressure in the furnace $P_1$ (first pressure in furnace) during the normal crystal pulling-up period ($P_2 < P_1$). The dopant adding period is, in a narrow sense, a period during which the dopant raw material 5 is actually being added, but in a broader sense, this means a period necessary for the dopant added into the silicon melt to be completely dissolved and the dislocation issue to no longer occur.

The amount of increase in the Ar gas flow rate $F_2$ with respect to the Ar gas flow rate $F_1$ is preferably 40 L/min or more and 300 L/min or less in a flow rate conversion at room temperature and atmospheric pressure. In addition, the Ar gas flow rate $F_2$ is preferably 120 L/min or more in the flow rate conversion at room temperature and atmospheric pressure, and preferably 1.5 times or more and 5 times or less of the Ar gas flow rate $F_1$. Accordingly, it is possible to prevent dislocation of the silicon single crystal caused by the non-melted secondary dopant being incorporated into the solid-liquid interface.

The amount of decrease in the pressure in the furnace $P_2$ with respect to the pressure in the furnace $P_1$ is preferably 1 Torr or more and 10 Torr or less. The probability of dislocation can be further reduced by changing the pressure in the furnace at the same time as the Ar gas flow rate.

After the counter doping ends, the values are restored to the Ar gas flow rate $F_1$ and the pressure in the furnace $P_1$ during the normal crystal pulling-up period (first period) and growth of the straight-trunk portion continues (steps S25, S26).

The counter doping steps are repeated according to a required crystal length (steps S27Y, S22Y, S23 to S25). After the counter doping ends, growth of the straight-trunk portion continues, and at the point when the counter doping is required again, the counter doping is initiated. The number of repetitions of the counter doping is predetermined and the counter doping is repeated until the specified number of counter dopings are completed. During the counter doping, each time, the Ar gas flow rate and the pressure in the furnace are changed to values ($F_2$, $P_2$) suitable for the counter doping respectively. In this way, by pulling up the silicon single crystal with the desired length while performing the counter doping the specified number of times, it is possible to increase the yield of silicon single crystals having a small change in resistivity in the pulling-up axis direction.

Figure 4:
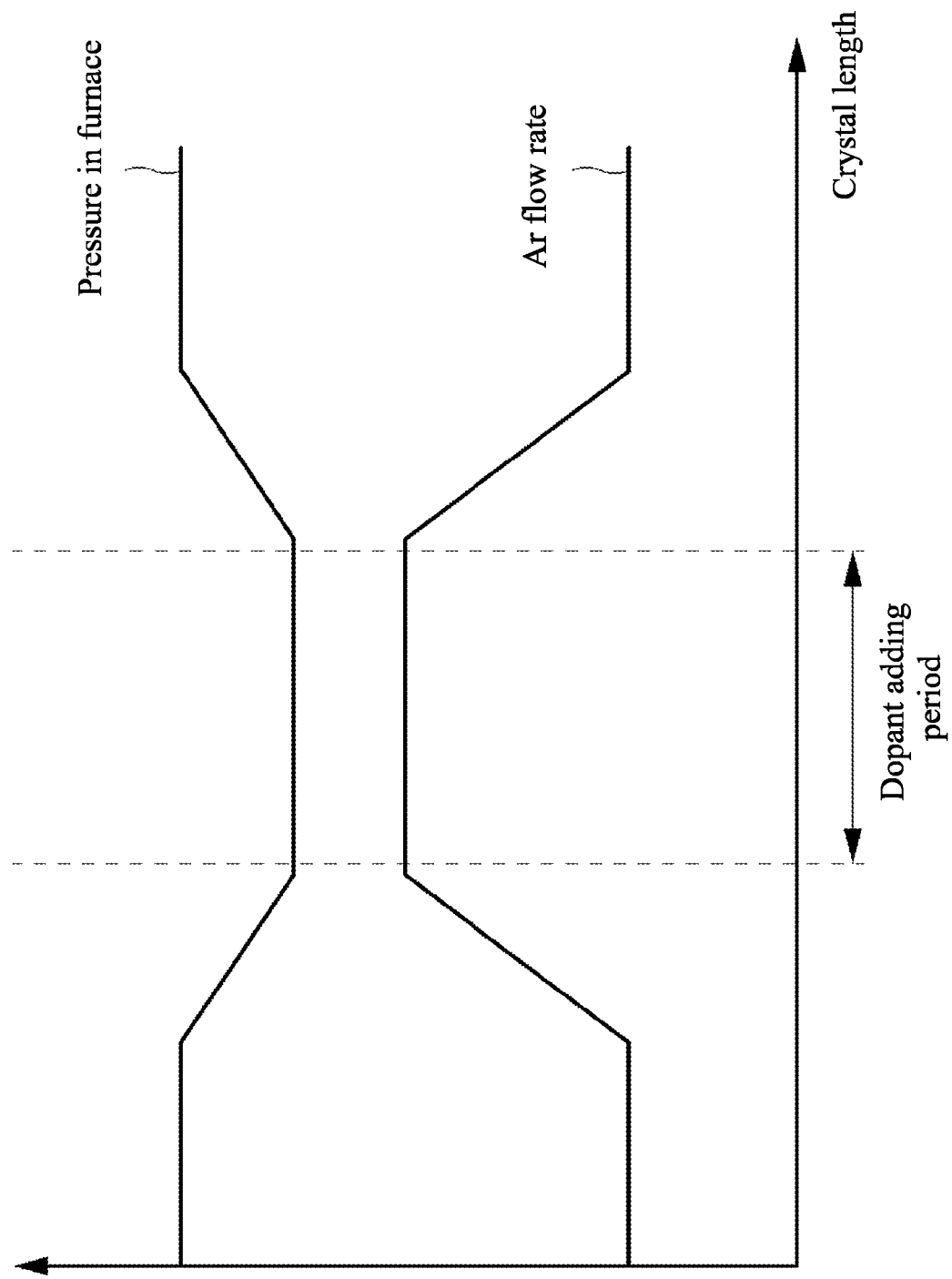
FIG. 4 is a graph illustrating a relationship between a dopant adding period, Ar gas flow rate, and a pressure in a furnace.

FIG. 4 is a graph illustrating a relationship between the dopant adding period, Ar gas flow rate, and pressure in the furnace.

As shown in FIG. 4, the pressure in the furnace is decreased and the Ar gas flow rate is increased during the dopant adding period. For example, the Ar gas flow rate during the dopant adding period (second period) is set to be double the Ar gas flow rate of the normal pulling-up period (first period) where the dopant is not added. In addition, the pressure in the furnace during the dopant adding period (second period) is set to be 80% of the pressure in the furnace in the normal pulling-up period (first period).

When the Ar gas flow rate introduced into the chamber 10 is increased, the flow speed of the Ar gas flowing from the center of the chamber 10 toward the outer side along the melt surface becomes fast, and therefore, the non-melted dopant drifting near the melt surface can be inhibited from approaching the solid-liquid interface between the silicon single crystal 2 and the silicon melt 3. Similarly, when the pressure in the furnace is increased, the flow speed of the Ar gas flowing from the center of the chamber 10 toward the outer side along the melt surface becomes fast, and therefore, the dopant can be inhibited from approaching the solid-liquid interface. Accordingly, by temporarily changing the Ar gas flow rate and the pressure in the furnace, it is possible to prevent dislocation of the single crystal caused by the dopant being incorporated into the solid-liquid interface between the silicon single crystal 2 and the silicon melt 3.

Figure 5:
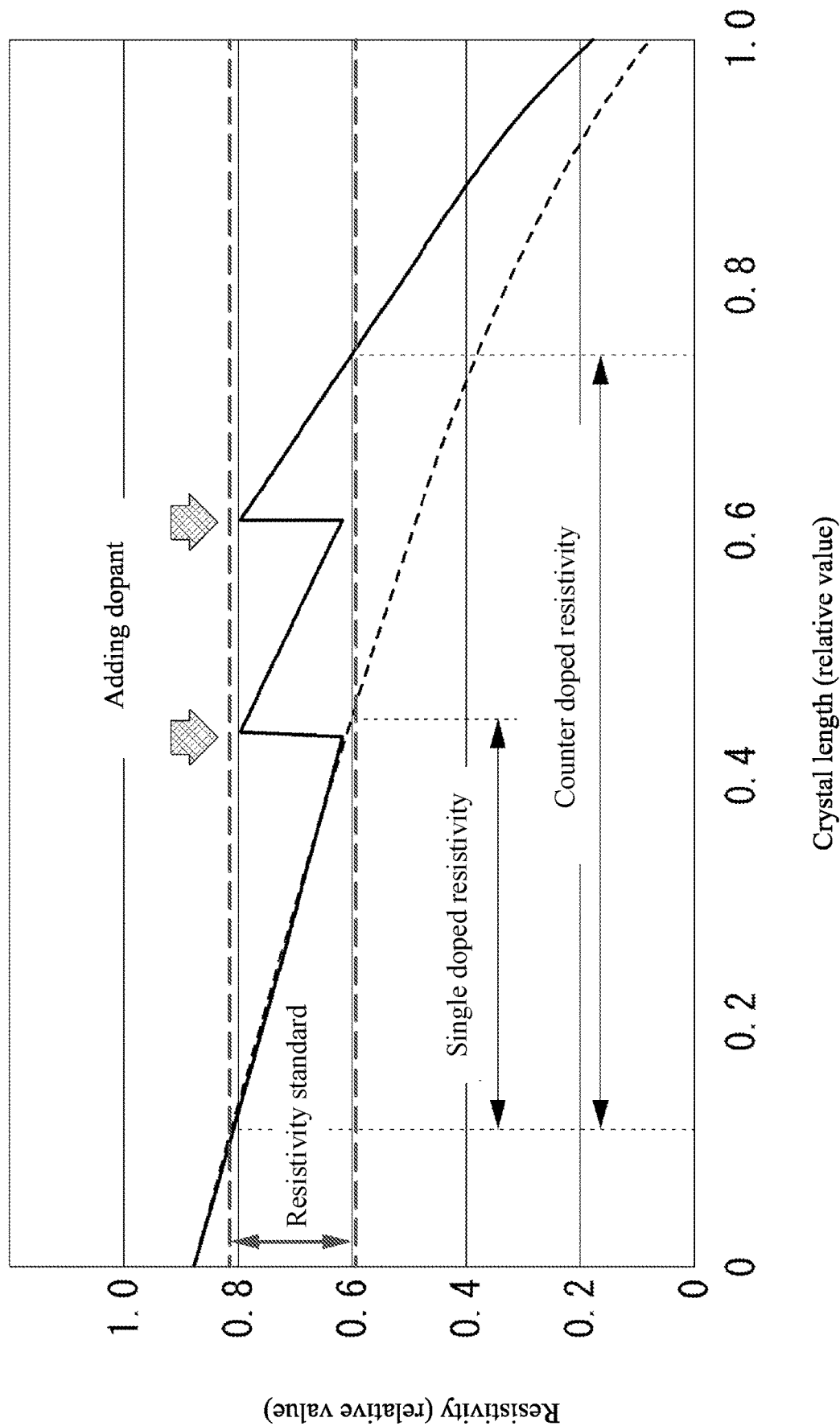
FIG. 5 is a graph illustrating a change of resistivity in the silicon single crystal when the counter doping is performed twice.

FIG. 5 is a graph illustrating a change of resistivity in the silicon single crystal when the counter doping is performed twice, with the horizontal axis representing the crystal length (relative value when the total length of the straight-trunk portion is defined as 1) and the vertical axis representing resistivity (relative value), respectively.

As shown in FIG. 5, in a case of a silicon single crystal doped with phosphorus alone as the primary dopant, the resistivity of the silicon single crystal is the highest at the start of pulling-up and only gradually decreases as pulling-up advances, and therefore the resistivity deviates from a standard when the crystal length exceeds approximately 0.44.

However, by performing a first counter doping at a point where the crystal length is approximately 0.44 and a second counter doping at a point where the crystal length is 0.63, the length of the single crystal in which the resistivity stays within the standard can be made as long as possible.

As described above, the manufacturing method of the silicon single crystal according to the present embodiment includes a step of adding the primary dopant of the silicon single crystal and the secondary dopant of the opposite conductivity type into the silicon melt during the pulling-up step of the silicon single crystal, and the Ar gas flow rate during the secondary dopant adding period is set higher than the period where the secondary dopant is not added and the pressure in the furnace is lowered, and therefore the dislocation of the single crystal can be prevented.

A preferable embodiment of the present invention was described above, but the present invention is not limited to the embodiment noted above, and various modifications are possible without departing from the scope of the present invention, and such modifications are, of course, covered by the scope of the present invention.

Embodiment

Comparative Example

The counter doping was performed without changing the Ar gas flow rate and the pressure in the furnace during the straight-trunk portion growing step of the n-type silicon single crystal using phosphorus (P) as the primary dopant. In the counter doping, a change in the resistivity due to the segregation of P was predicted and boron (B) which was the secondary dopant was added right before the resistivity deviated from the standard. As a result, the dislocation of the silicon single crystal occurred immediately after adding the secondary dopant.

Example

The counter doping was performed twice in the midst of the straight-trunk portion growing step of the n-type silicon single crystal using phosphorus (P) as the primary dopant. During the counter doping, the Ar gas flow rate was increased up to two times of the normal rate and after maintaining for 15 minutes a state with this increased Ar gas flow rate, the Ar gas flow rate was restored to the normal rate (see FIG. 4). Also, at the same time, the pressure in the furnace was decreased by 5 Torr lower than the normal pressure and after maintaining for 15 minutes a state with this decreased pressure in the furnace, the pressure in the furnace was restored to the normal pressure (see FIG. 4). It took 20 minutes to change the Ar gas flow rate and the pressure in the furnace (increase and decrease). The secondary dopant was added during a period that kept constant the state when the Ar gas flow rate was increased and the state when the pressure in the furnace was reduced. As a result, the silicon single crystal could be pulled up until completion without dislocation.

To check resistivity distribution in the crystal length direction of the silicon single crystal obtained in this way, a sample was obtained by vertically splitting a crystal block near the location where the dopant was added, a grinding process was performed such that the sample thickness becomes 1.0 mm, and a donor killer treatment (650° C., 40 minutes heat treatment) was further performed for the resistivity measurement.

Figure 6:
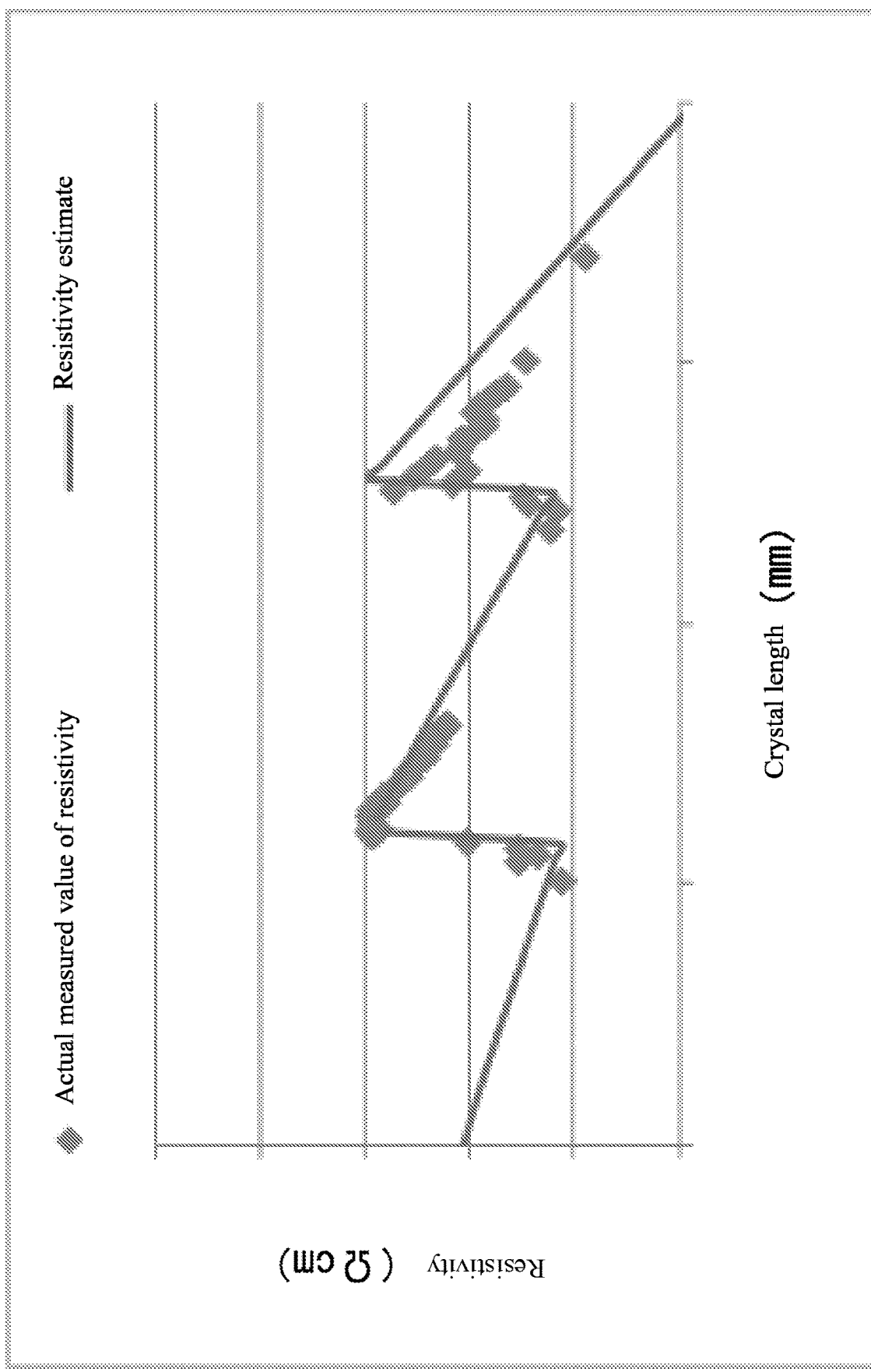
FIG. 6 is a graph illustrating results where the resistivity of the silicon single crystal according to an embodiment was measured using the four-point probe method.

The resistivity of the sample was then measured by the four-point probe method. Measurement pitch for the resistivity was 1 mm near the location where the secondary dopant was added and 5 mm everywhere else. The result of continuous resistivity measurements is shown in FIG. 6. As shown in the drawing, the resistivity is increased immediately after adding the dopant and then obtained a resistivity in line with the segregation. The resistivity after adding the secondary dopant the second time was slightly lower than the targeted resistivity, but generally favorable results were obtained.

The pulling-up of the silicon single crystal was performed four times accompanied by the counter doping described above, however, the dislocation did not occur in any of the silicon single crystal and favorable results were obtained.

DESCRIPTION OF REFERENCE NUMERALS

1 Single crystal manufacturing device
2 Silicon single crystal
3 Silicon melt
5 Dopant (Secondary dopant)
10 Chamber
10a Main chamber
10b Top chamber
10c Pull chamber
10d Gas inlet
10e Gas exhaust port
10f Opening
11 Thermal insulation material
12 Quartz crucible
13 Susceptor
14 Shaft
15 Heater
16 Heat shielding member
17 Wire
18 Wire winding mechanism
19 Shaft driving mechanism
20 Dopant supply device
21 Dopant supply tube
22 Dopant hopper
23 Seal cap
30 Controller
31 Ar gas supply source
32 Mass flow controller
33 Vacuum pump
34 Valve
S11 Raw material filling step
S12 Melting step
S13 Melt contacting step
S14 Necking step
S15 Shoulder growing step
S16 Straight-trunk portion growing step
S17 Tail growing step

The invention claimed is:

1. A manufacturing method of a silicon single crystal comprising:
generating a silicon melt containing a primary dopant; and
pulling up the silicon single crystal from the silicon melt,
wherein the pulling up of the silicon single silicon crystal comprises at least one additional doping process for adding a secondary dopant into the silicon melt,
a flow rate of Ar gas supplied to a pulling-up furnace during a first period in which the secondary dopant is not added is set as a first flow rate, and
the flow rate of Ar gas supplied to the pulling-up furnace during a second period that includes a period in which the secondary dopant is added is set as a second flow rate that is greater than the first flow rate;
wherein the at least one additional doping process increases the Ar gas flow rate to the second flow rate before beginning to add the secondary dopant, and restores the Ar gas flow rate to the first flow rate after addition of the secondary dopant ends.

2. The manufacturing method of the silicon single crystal according to claim 1, wherein an amount of increase in the second flow rate with respect to the first flow rate is 40 L/min or more and 300 L/min or less in a flow rate conversion at room temperature and atmospheric pressure.

3. The manufacturing method of the silicon single crystal according to claim 1, wherein the second flow rate is 120 L/min or more in a flow rate conversion at room temperature and atmospheric pressure.

4. The manufacturing method of the silicon single crystal according to claim 1, wherein the second flow rate is 1.5 times or more and 5 times or less of the first flow rate.

5. The manufacturing method of the silicon single crystal according to claim 1, wherein a pressure in the pulling-up furnace during the first period is set as a first pressure in a furnace, and
the pressure in the pulling-up furnace during the second period is set as a second pressure in a furnace that is lower than the first pressure in the furnace.

6. The manufacturing method of the silicon single crystal according to claim 5, wherein an amount of decrease of the second pressure in the furnace with respect to the first pressure in the furnace is 1 Torr or more and 10 Torr or less.

7. The manufacturing method of the silicon single crystal according to claim 1, wherein a cylindrical heat shielding member is arranged above the silicon melt to surround the silicon single crystal being pulled up from the silicon melt.

8. The manufacturing method of the silicon single crystal according to claim 1, wherein an oxygen concentration in the silicon single crystal is $6 \times 10^{17}$ atoms/cm$^3$ (ASTM F-121, 1979) or less.

9. The manufacturing method of the silicon single crystal according to claim 1, wherein an electrical resistivity of the silicon single crystal is 10 Ωcm or more and 1000 Ωcm or less.

* * * * *